United States Patent
Mali

(10) Patent No.: US 8,745,200 B2
(45) Date of Patent: Jun. 3, 2014

(54) TESTING OPERATION OF PROCESSORS SETUP TO OPERATE IN DIFFERENT MODES

(75) Inventor: Vinayak Mohan Mali, Bangalore (IN)

(73) Assignee: NVIDIA Corporation, Santa Clara, CA (US)

( * ) Notice: Subject to any disclaimer, the term of this patent is extended or adjusted under 35 U.S.C. 154(b) by 340 days.

(21) Appl. No.: 12/115,571

(22) Filed: May 6, 2008

(65) Prior Publication Data

US 2009/0282143 A1 Nov. 12, 2009

(51) Int. Cl.
*G06F 15/173* (2006.01)
*G06F 9/44* (2006.01)
*G06F 11/00* (2006.01)

(52) U.S. Cl.
USPC .......................... 709/224; 717/124; 714/742

(58) Field of Classification Search
None
See application file for complete search history.

(56) References Cited

U.S. PATENT DOCUMENTS

| | | |
|---|---|---|
| 2,795,755 A | 6/1957 | Antfies |
| 3,870,953 A | 3/1975 | Boatman et al. |
| 4,700,293 A | 10/1987 | Grone |
| 5,247,689 A | 9/1993 | Ewert |
| 5,257,223 A | 10/1993 | Dervisoglu |
| 5,258,648 A | 11/1993 | Lin |
| 5,262,719 A | 11/1993 | Magdo |
| 5,409,568 A | 4/1995 | Vasche |
| 5,428,622 A | 6/1995 | Kuban et al. |
| 5,499,248 A | 3/1996 | Behrens et al. |
| 5,579,510 A | 11/1996 | Wang et al. |
| 5,635,718 A | 6/1997 | DePuydt et al. |
| 5,807,763 A | 9/1998 | Motika et al. |
| 5,818,252 A | 10/1998 | Fullman et al. |
| 5,834,844 A | 11/1998 | Akagawa et al. |
| 5,880,592 A | 3/1999 | Sharpes et al. |
| 5,913,034 A | 6/1999 | Malcolm |
| 5,946,372 A * | 8/1999 | Jones et al. ................. 379/10.01 |
| 5,966,021 A | 10/1999 | Eliashberg et al. |
| 5,996,099 A | 11/1999 | Fournel et al. |
| 6,011,748 A | 1/2000 | Lepejian et al. |
| 6,049,900 A | 4/2000 | Fournel et al. |
| 6,055,619 A * | 4/2000 | North et al. ..................... 712/36 |
| 6,056,784 A | 5/2000 | Stanion |
| 6,057,698 A | 5/2000 | Heo et al. |

(Continued)

FOREIGN PATENT DOCUMENTS

DE 19515591 10/1995

OTHER PUBLICATIONS

S. Gerstendorfer and H.J. Wunderlich, "Minimized Power Consumption for Scan-Based Bist", International Test Conference, Date: Sep. 1999, pp. 77-84.

(Continued)

*Primary Examiner* — Wen-Tai Lin

(57) ABSTRACT

Testing operation of processors setup to operate in different modes. In an embodiment, each tester system includes a processor setup to operate in a corresponding mode. A user sends a test request to a scheduler system indicating the mode of the processor sought to be tested, and the scheduler system forwards the test request to one of the tester systems with a processor setup to test the requested configuration. The scheduler system may maintain configuration information indicating which processors are setup to test which modes of interest, and also status information indicating which tester systems are presently available for testing. The configuration information and status information is used in determining a specific suitable tester system to which a test request is to be forwarded.

22 Claims, 8 Drawing Sheets

(56) References Cited

U.S. PATENT DOCUMENTS

| | | |
|---|---|---|
| 6,081,429 A | 6/2000 | Barrett |
| 6,085,346 A | 7/2000 | Lepejian et al. |
| 6,097,087 A | 8/2000 | Farnworth et al. |
| 6,133,744 A | 10/2000 | Yojima et al. |
| 6,246,252 B1 | 6/2001 | Malladi et al. |
| 6,247,165 B1 | 6/2001 | Wohl et al. |
| 6,297,654 B1 | 10/2001 | Barabi |
| 6,307,162 B1 | 10/2001 | Masters et al. |
| 6,336,212 B1 * | 1/2002 | Gray et al. .......... 717/124 |
| 6,380,555 B1 | 4/2002 | Hembree et al. |
| 6,392,432 B1 | 5/2002 | Jaimsomporn et al. |
| 6,420,888 B1 | 7/2002 | Griffin et al. |
| 6,429,532 B1 | 8/2002 | Han et al. |
| 6,472,895 B2 | 10/2002 | Jaimsomporn et al. |
| 6,472,900 B1 | 10/2002 | Malladi et al. |
| 6,519,729 B1 | 2/2003 | Whetsel |
| 6,534,853 B2 | 3/2003 | Liu et al. |
| 6,590,294 B1 | 7/2003 | Lee et al. |
| 6,622,273 B1 | 9/2003 | Barnes |
| 6,686,615 B1 | 2/2004 | Cheng et al. |
| 6,750,646 B1 | 6/2004 | Voss et al. |
| 6,763,488 B2 | 7/2004 | Whetsel |
| 6,769,080 B2 | 7/2004 | Whetsel |
| 6,873,927 B2 | 3/2005 | Chi et al. |
| 6,876,215 B1 | 4/2005 | Hannan et al. |
| 6,878,172 B2 | 4/2005 | Jensen |
| 6,884,642 B2 | 4/2005 | Farnworth et al. |
| 6,914,424 B2 | 7/2005 | Chi et al. |
| 6,915,468 B2 * | 7/2005 | Chambers et al. .......... 714/719 |
| 6,933,524 B2 | 8/2005 | Hembree et al. |
| 7,020,699 B2 * | 3/2006 | Zhang et al. .......... 709/223 |
| 7,051,257 B2 | 5/2006 | Whetsel |
| 7,216,050 B1 | 5/2007 | Bachman et al. |
| 7,279,887 B1 | 10/2007 | King et al. |
| 7,428,715 B2 | 9/2008 | Fournier et al. |
| 7,523,369 B2 | 4/2009 | Chang |
| 7,568,142 B2 | 7/2009 | Whetsel |
| 7,636,871 B1 | 12/2009 | Blue et al. |
| 7,761,751 B1 | 7/2010 | West |
| 7,765,443 B1 | 7/2010 | Syed et al. |
| 7,842,948 B2 | 11/2010 | Schieck et al. |
| 8,271,252 B2 | 9/2012 | Chatterjee et al. |
| 8,368,416 B2 | 2/2013 | King et al. |
| 8,510,616 B2 | 8/2013 | Singhal |
| 2001/0006233 A1 | 7/2001 | Vallett |
| 2001/0010356 A1 | 8/2001 | Talbot et al. |
| 2002/0016952 A1 | 2/2002 | Chang et al. |
| 2003/0018945 A1 | 1/2003 | Foster et al. |
| 2003/0023912 A1 | 1/2003 | Lesea |
| 2003/0101395 A1 * | 5/2003 | Man et al. .......... 714/726 |
| 2003/0119297 A1 | 6/2003 | Lam et al. |
| 2003/0120829 A1 * | 6/2003 | Avvari et al. .......... 709/330 |
| 2003/0124816 A1 | 7/2003 | Potts |
| 2003/0131717 A1 | 7/2003 | Shiiya |
| 2004/0015762 A1 * | 1/2004 | Klotz et al. .......... 714/742 |
| 2005/0055617 A1 | 3/2005 | Wang et al. |
| 2005/0166110 A1 | 7/2005 | Swanson et al. |
| 2008/0021669 A1 * | 1/2008 | Blancha et al. .......... 702/122 |
| 2008/0115005 A1 | 5/2008 | Kamada |
| 2008/0122463 A1 * | 5/2008 | Dabral et al. .......... 324/753 |
| 2008/0222205 A1 | 9/2008 | Lange |

OTHER PUBLICATIONS

Chatterjee, Prosenjit, Article entitled: "Streamline Verification Process With Formal Property Verification to Meet Highly Compressed Design Cycle", pp. 674-677.

D. Heidel et al., "High Speed Serializing/De-Serializing Design for Test Method for Evaluating a 1Ghz Microprocessor", Proceedings VLSI Test Symposium, Date: IEEE 1998, pp. 234-238.

Harald Varnken, Tom Waayers, Nerve Fleury and David Lelouvier, "Enhanced Reduced Pincount Testin for Full-Scan Design", Proceedings of the 2001 International Test Conference, Date: 2001, pp. 738-747.

Ko et al., "A Novel Automated Scan Chain Division Method for Shift and Capture Power Reduction in Broadside At-Speed Test", Quality Electronic Design, 2008 ISQED 2008. 9th International Symposium Quality Electronic Design, pp. 649-654.

Nicolici et al., "Multiple Scan Chains for Poer Minimization During Test Application in Sequestial Circuits", IEEE Transactions on Computers, vol. 51, No. 6, pp. 721-734, Jun. 2002.

R.M. Chou, K.K. Saluja and V.D. Agrawal, "Scheduling Test for Vlsi Systems Under Power Constraints", IEEE Transactions on Very Large Scale Integration Systems, Date: Jun. 1997, pp. 175-185, vol. 5, No. 2.

Ranganathan Sankaralingam, B. Pouya, and Nur A. Touba, "Reducing Test Power During Test Using Programmable Scan Chain Disable" 19th IEEE Proceedings of the VLSI Test Symposium, Date: Apr. 2001, pp. 319-324.

Rosinger et al., "Scan Architecture with Manually Exclusive Scan Segment Activation for Shift and Capture Power Reduction" IEEE Trans. On Computer Aided Design of Integrated Circuits and systems, vol. 23, No. 7, 019. 1142-1153, Jul. 2004.

S. Chakravarthy and V.P. Dabholkar, "Two Techniques for Minimizing Power Dissipation in Scan Circuts During Test Application", Proceedings of the third Asian Test Symposium, Date: Nov. 1994, pp. 324-329.

S. Wang and S.K. Gupta, "LT-RTPG: A New Test-Per-Scan Bist TPG for Low Heat Dissipation", International Test Conference, Date: Sep. 1999, pp. 85-94.

Saxena. J, Butler Kenneth M and Whetsel Lee, "An Analysis O Power Reduction Techniques in Scan Testing", Proceedings of International Test Conference, 2001, Date: Oct. 2001, pp. 670-677.

V.P. Dabholkar, S. Chakravarthy, I.Pomeranz and S. Reddy, "Techniques for Minimizing Power Dissipation in Scan and Combinational Circuits During Test Application", IEEE Transaction on Computer-Aided Design of Integrated Circuits and Systems, Date: Dec. 1998, pp. 1325-1333, vol. 17, Issue 12.

Y.Zorian, "Testing the Monster Chip" IEEE Spectrum, Date: Jul. 1999, pp. 1119-1122.

* cited by examiner

| TESTER SYSTEM | Addressing mode | | | IP Address | PORT NUMBER | STATUS |
| --- | --- | --- | --- | --- | --- | --- |
| | 16D | 16ID | 32D | 32ID | | | |
| Hpux123 | 0 | 0 | 1 | 0 | 165.233.245.2 | 2050 | BUSY |
| Wdw234 | 1 | 0 | 0 | 0 | 165.213.246.2 | 2050 | BUSY |
| Hpux766 | 0 | 1 | 0 | 0 | 165.233.247.1 | 2050 | BUSY |
| Hpux432 | 1 | 0 | 0 | 0 | 165.233.207.1 | 2050 | FREE |

| | JOB ID | USER SYSTEM | TESTER SYSTEM | STATUS | Email ID |
|---|---|---|---|---|---|
| 701→ | 2751 | BTC6l017 | Hpux123 | RUNNING | tom@nvidia.com |
| 702→ | 2306 | BTC6l010 | Wdw234 | RUNNING | sue@nvidia.com |
| 703→ | 2907 | BTC6l112 | Hpux432 | DONE | bill@nvidia.com |
| 704→ | 3307 | BTC2l114 | Hpux766 | RUNNING | joe@nvidia.com |

| | JOB ID | USER SYSTEM | TESTER SYSTEM | STATUS | Email ID |
|---|---|---|---|---|---|
| 701→ | 2751 | BTC6l017 | Hpux123 | RUNNING | tom@nvidia.com |
| 702→ | 2306 | BTC6l010 | Wdw234 | RUNNING | sue@nvidia.com |
| 703→ | 2122 | BTC6l113 | Hpux432 | RUNNING | bill@nvidia.com |
| 704→ | 3307 | BTC2l114 | Hpux766 | RUNNING | joe@nvidia.com |

710, 720, 730, 740, 795

US 8,745,200 B2

TESTING OPERATION OF PROCESSORS SETUP TO OPERATE IN DIFFERENT MODES

BACKGROUND

1. Field of Disclosure

The present disclosure relates generally to testing of systems, and more specifically to a method and apparatus for testing operation of processors setup to operate in different modes.

2. Related Art

Processors generally refer to components, which execute instructions and provide the corresponding functionality. Examples of processors include central processing units, graphics controllers, units providing a combination of features provided by central processing units and graphics controllers, etc., as is well known in the relevant arts.

Processors are often implemented to operate in different modes. Each mode generally defines a fundamental characteristic of operation of a processor, consistent with which instructions are to be designed (for execution on the processor). Examples of such fundamental characteristics generally include addressing mode (direct/indirect), bus width (16 bit/ 32 bit) etc.

A processor is often setup to operate in one of several possible modes. As used herein, setting up of a processor in a mode implies that the mode cannot be further changed by software instructions during testing and can be determined by features such as positions of dip switches (potentially operable to be placed in different positions), the programming of EEPROMs to specific circuit topology, etc.

It is often desirable to test processors in various modes of configuration. Testing generally implies executing a corresponding set of instructions to check whether the processor operates in a desired manner. Testing is performed before the processors are placed in production environments. It is generally desirable that the testing meet various requirements specific to the corresponding environment.

BRIEF DESCRIPTION OF THE DRAWINGS

Example embodiments will be described with reference to the following accompanying drawings, which are described briefly below.

FIG. 6 depicts the content of a resource table used by a scheduler system in an embodiment.

FIGS. 7A and 7B depict the content of job queues at corresponding time instances in an embodiment.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1:
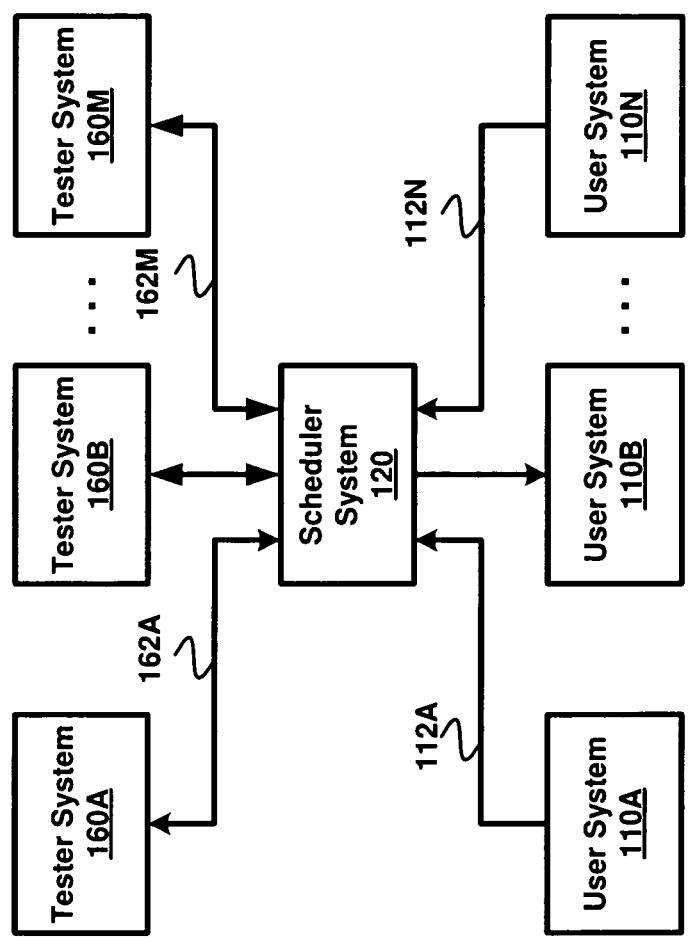
FIG. 1 is a block diagram of an example environment in which several aspects of the present invention may be implemented.

An aspect of the present invention enables testing operation of processors setup to operate in different modes. A processing being setup in a mode implies that the configuration cannot be changed at least during performance of a test due to, for example, hardware control/characteristic of the configuration and/or it is a fundamental feature of the operating environment which cannot be changed by executing of higher level applications.

In an embodiment, each tester system includes a processor setup to operate in a corresponding mode. A user sends a test request to a scheduler system indicating the mode of the processor sought to be tested, and the scheduler system forwards the test request to one of the tester systems with a processor setup to test the requested configuration. Due to the use of a central scheduler system, all tester systems can be efficiently used by several user systems from which test requests are sent.

The scheduler system may maintain configuration information indicating which processors are setup to test which modes of interest, and also status information indicating which tester systems are presently available for testing. The configuration information and status information is used in determining a specific suitable tester system to which a test request is to be forwarded.

Several aspects of the invention are described below with reference to examples for illustration. It should be understood that numerous specific details, relationships, and methods are set forth to provide a full understanding of the invention. For example, many of the functional units described in this specification have been labeled as modules/blocks in order to more particularly emphasize their implementation independence.

A module/block may be implemented as a hardware circuit containing application specific integration circuits or gate arrays, off-the-shelf semiconductors such as logic chips, transistors or other discrete components. A module/block may also be implemented in programmable hardware devices such as field programmable gate arrays, programmable array logic, programmable logic devices, or the like.

Modules/blocks may also be implemented in software for execution by various types of processors. An identified module of executable code may, for instance, contain one or more physical or logical blocks of computer instructions which may, for instance, be organized as an object, procedure, or function. Nevertheless, the executables of an identified module need not be physically located together, but may contain disparate instructions stored in different locations which when joined logically together constitute the module/block and achieve the stated purpose for the module/block.

It may be appreciated that a module/block of executable code could be a single instruction, or multiple instructions and may even be distributed over several code segments, among different programs, and across several memory devices. Further, the functionality described with reference to a single module/block can be split across multiple modules/ blocks or alternatively the functionality described with respect to multiple modules/blocks can be combined into a single module/block (or other combination of blocks) as will be apparent to a skilled practitioner based on the disclosure provided herein.

Similarly, operational data may be identified and illustrated herein within modules and may be embodied in any suitable form and organized within any suitable type of data structure. The operational data may be collected as a single data set, or may be distributed over different locations including over different member disks, and may exist, at least partially, merely as electronic signals on a system or network.

Reference throughout this specification to "one embodiment", "an embodiment", or similar language means that a particular feature, structure, or characteristic described in connection with the embodiment is included in at least one embodiment of the present invention. Thus, appearances of the phrases "in one embodiment", "in an embodiment" and similar language throughout this specification may, but do not necessarily, all refer to the same embodiment.

Furthermore, the described features, structures, or characteristics of the invention may be combined in any suitable manner in one or more embodiments. In the following description, numerous specific details are provided such as examples of programming, software modules, user selections, network transactions, database queries, database structures, hardware modules, hardware circuits, hardware chips, etc., to provide a thorough understanding of embodiments of the invention.

However one skilled in the relevant art will recognize that the invention can be practiced without one or more of the specific details or with other methods, components, materials and so forth. In other instances, well-known structures, materials, or operations are not shown in detail to avoid obscuring the features of the invention. Furthermore the features/aspects described can be practiced in various combinations, though only some of the combinations are described herein for conciseness.

2. Example Environment

FIG. 1 is a block diagram of an example environment in which several aspects of the present invention may be implemented. The diagram is shown containing tester systems 160A-160M, scheduler system 120, and user systems 110A-110N. Each system is described below in detail.

Each of tester systems 160A through 160M contains a corresponding set of processors, with each processor setup to operate in a set (one or more) of several possible modes. Accordingly, each tester system is designed to process test requests corresponding to any of these set of modes. In general, each tester system receives corresponding test requests from scheduler system 120 (via respective paths, 162A through 162M), and processes (execute) the test requests. The results of the test requests may be communicated back to the user, scheduler system 120 and/or user system from which the test originated. Various approaches can be used for such communication back, as will be apparent to one skilled in the relevant arts.

Each user system 110A through 110N enables a user/tester to indicate a specific mode of a processor sought to be tested, and sends the corresponding information to scheduler system 120. The user may be provided the ability to provide any addition information as well, according to a suitable user interface, as suited for the specific environment.

Scheduler system 120 receives test requests (each to test corresponding mode of processors) from one or more user systems 160A-110N (via corresponding paths 112A-112N), and forwards each test request to a suitable one of tester systems 160A-160M based setup to test the modes indicated in the test request.

It should be appreciated that scheduler system 120 may be implemented to determine the specific one of the tester systems suited for processing each test request and forward the request to the determined tester system, using one of several approaches. The description is continued with examples illustrating the operation of the scheduler system in corresponding illustrative embodiments.

3. Flowchart

Figure 2:
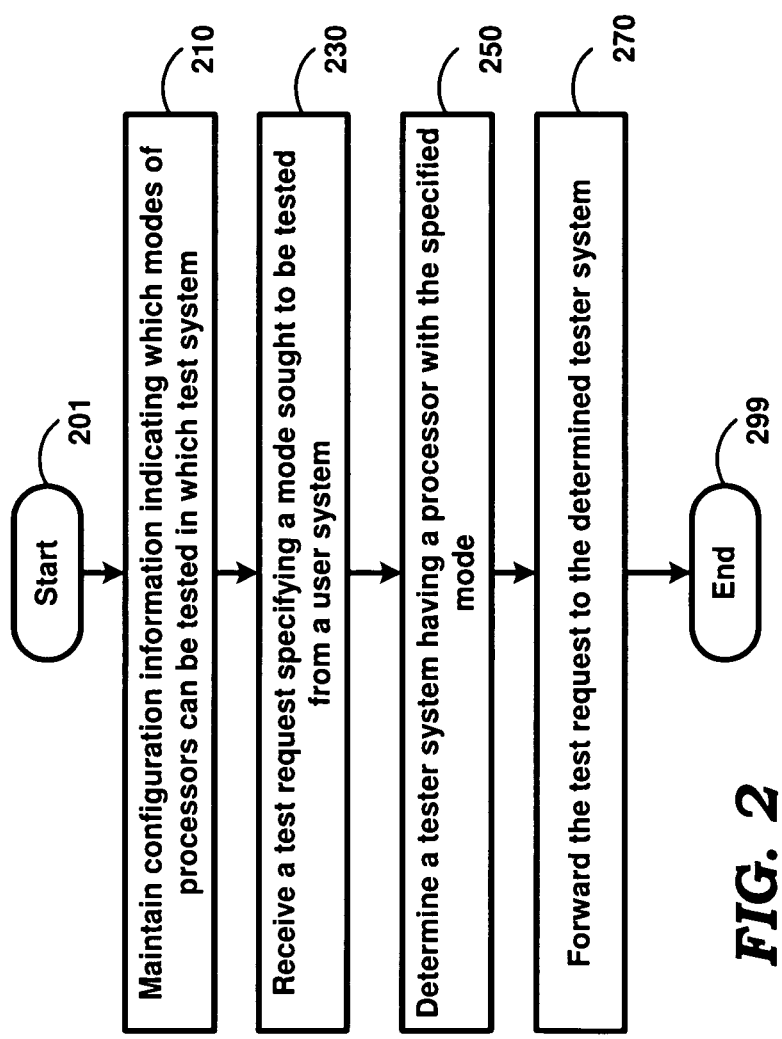
FIG. 2 is a flowchart illustrating the manner in which processors setup in different modes are can be tested according to an aspect of the present invention.

FIG. 2 is a flow chart of illustrating the manner in which a scheduler system operates to enable testing operation of processors in different modes according to an aspect of the present invention. The flowchart is described with respect to FIG. 1 merely for illustration. However, various features can be implemented in other environments. Furthermore, the steps are described in a specific sequence merely for illustration.

Alternative embodiments in other environments and different sequence of steps can also be implemented without departing from the scope and spirit of several aspects of the present invention, as will be apparent to one skilled in the relevant arts by reading the disclosure provided herein. The flowchart starts in step 201, in which control passes immediately to step 210.

In step 210, scheduler system 120 maintains configuration information indicating which modes of processors can be tested in a tester system. In general, maintaining entails storing the corresponding table in a form suitable for further processing (accessing/changing desired portion of the information, etc.). Data structures such as tables may be used to maintain the information and such data structures may be stored in a random access memory (RAM) type components, which lend to faster access.

In step 230, scheduler system 120 receives from a user system a test request specifying a mode sought to be tested. The test request can be received in any format consistent with the implementation of the user system (from which the request is received) and scheduler system 120. The test request can contain any additional information as suited for the specific environment.

In step 250, scheduler system 120 determines a tester system having a processor with the specified mode. The determination is based on comparing the configuration information of step 210 with the mode contained in the test request received in step 230, and selecting a tester system setup with the compared mode.

In step 270, scheduler system 120 forwards the test request to the determined tester system. In general, any of the information received in step 210, that is required for identification/performance of the test may be included in the information sent to the determined tester system. The information needs to be forwarded consistent with the interface requirements implemented within the tester system. The flowchart ends in step 299.

The tester system receiving the test request may test the requested mode, for example, in a known way, and provide the results to the user invoking the test in a suitable format.

It should be appreciated that the features described above can be applied in the context of different implementations of tester systems. The description is continued with respect to relevant features of the tester system sought to be tested in an example embodiment.

4. Tester System

Figure 3:
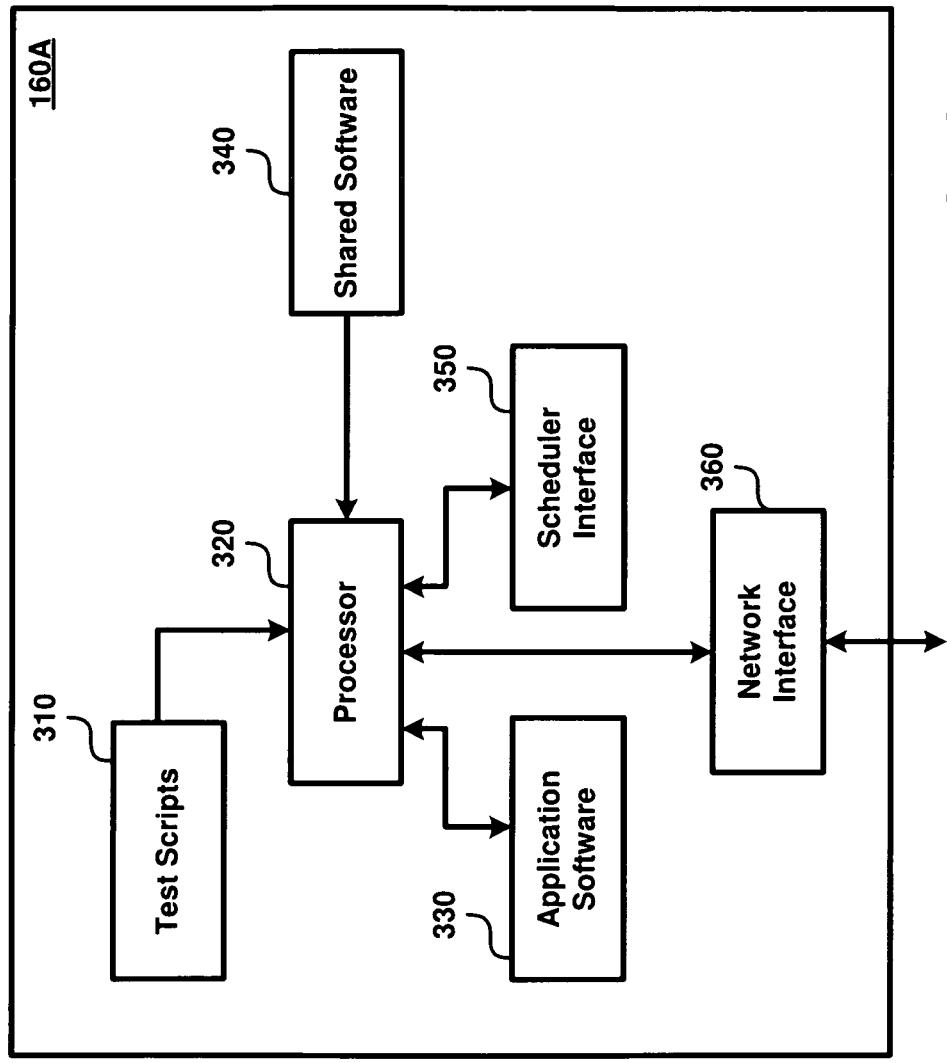
FIG. 3 is a block diagram illustrating the details of a tester system in an embodiment.

FIG. 3 is a block diagram illustrating the different components of a tester system in an embodiment. Tester system 160A is shown containing test scripts 310, processor 320, application software 330, shared software 340, scheduler interface 350, and network interface 360. Only the blocks as relevant to understanding of the features described herein, are included in the Figure(s) for illustration. However, tester systems can contain various other components/blocks as suited in the specific situation. Each of the blocks is described below in further detail.

Network interface 360 provides the physical, electrical and protocol interfaces to enable packets of data to be sent to and received from various external systems. The data forms the basis for receiving test requests, downloading of various builds of the software, sending test results, etc. Network interface 360 may be implemented using technologies such as Ethernet and TCP/IP, well known in the relevant arts.

Shared software 340 contains software instructions representing components such as operating system and drivers, which upon execution by processor 320, provide a shared environment in which various applications can be executed. In case processor 320 represents a graphics processing unit (GPU), the shared software may contain various drivers for operating the video/audio CODECs, etc.

Application software 330 represents various user applications which execute in the context of the shared environment provided by execution of shared software 340. The application software provides various utilities (based on audio, video, displays, data exchange with external systems, compression/decompression, etc.).

Test scripts 310 represents testing software, which can be invoked to perform each desired test. In an embodiment designed to process video/audio streams, the tests are categorized into four parts—conformance (whether an input stream received corresponds a standard such as H.264), functionality (whether an expected output is generated for a corresponding input stream), performance (the amount of time taken to complete a test), and robustness (stress testing).

A test request accordingly specifies one of such categories, and the corresponding test scipt(s) is invoked in response. The test scripts can be implemented in a known way. In an embodiment, the test scripts are coded in Perl Language, well known in the relevant art. However, other languages and techniques can be employed to perform desired tests, as will be apparent to a skilled practitioner based on the description herein. When tested, it is assumed that the tested software stores the test results in a pre-specified location according to a known convention.

Processor 320 is configurable to one of several modes using a suitable mechanism such as dip switches and other mechanisms. Once configured, the mode may not be changed by execution of software instructions at least in the middle of testing using a test request, and thus the processor is said to be setup in the corresponding mode. Processor 320 executes the instructions in each of application software 330, shared software 340 and scheduler interface 350.

In an embodiment, the modes have two variables—number of bits used in addressing and whether direct or indirect addressing is employed with such number of bits. For illustration it is assumed that there are only 16-bit and 32-bit addressing, and thus four possible processor modes are presented (16 bit direct, 16 bit indirect, 32 bit direct and 32 bit indirect). The number of bits used can be specified by one set of dip switches (e.g., in one position 16 bits are being used and in another position 32 bits are being used) and the addressing mode may be similarly specified using another set of dip switches. Processor 320 can determine the position of such dip switches by execution of appropriate software instructions. The description is accordingly continued assuming these four different (processor) modes of operation, and that the processor is setup to operate in only one of the four (processor) modes.

It should be appreciated that the structure/design of various instructions in shared software 340 and application software 330 depends on the mode in which processor 320 is configured. In addition, as is common in software development environments, the software may get incrementally refined to address various, bugs, etc. Accordingly, a version of the software suited for a specific mode of operation may be termed as a 'build', with each build being identified by a corresponding build (or release) identifier.

Figure 5:
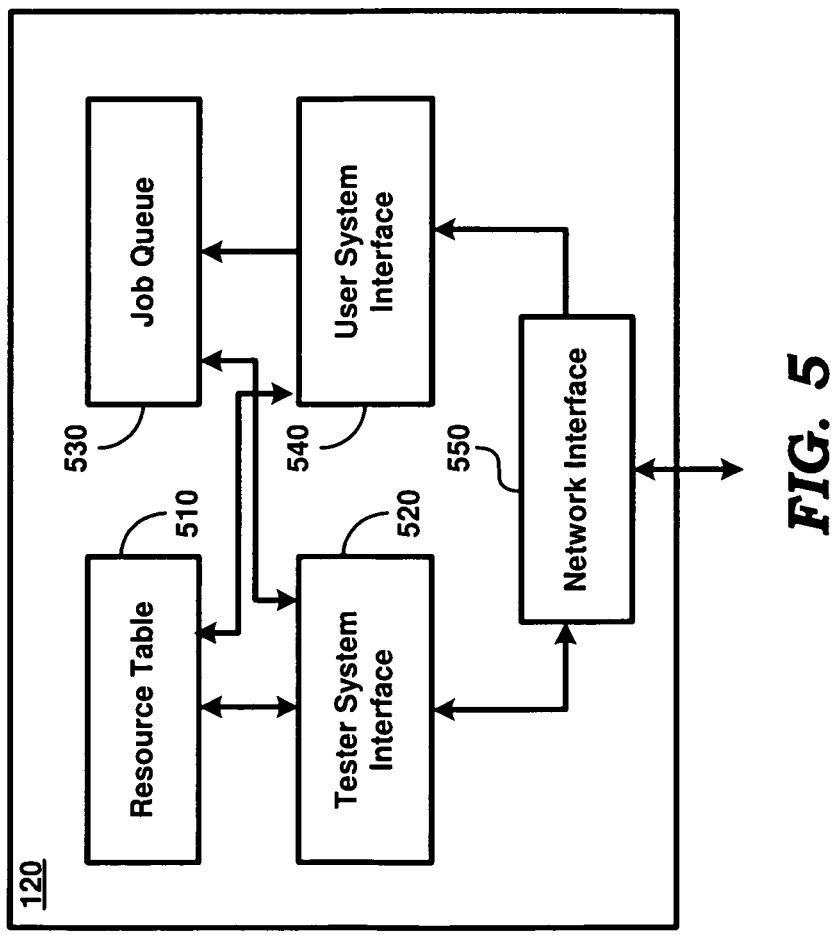
FIG. 5 is a block diagram illustrating the details of a scheduler system in an embodiment of the present invention.

Scheduler interface 350 may register (in scheduler system 120) resource information indicating the specific configured mode and the specific interface mechanism (IP address and port number, in the illustrative embodiment of FIG. 5) by which tests for the configured mode may be sent to tester system 160A.

Thus, the configured mode indicates one of 16 bit direct, 16 bit indirect, 32 bit direct and 32 bit indirect, to which the environment in tester system 160A is setup. The interface mechanism may specify a TCP port number at which the requests are received. The modes supported and the interface mechanism can be determined in known way, by examining the appropriate registers/information available within the tester system (reflecting the status/position of the dip switches in an embodiment), and then the corresponding information sent to scheduler system 120 for registration.

Thereafter, scheduler interface 350 may receive test requests for the configured mode, along with a build identifier and category of tests. Scheduler interface 350 may confirm that the software (330 and/or 340) corresponds to the requested builder/version identifier level, and invoke the test scripts corresponding to the requested category of tests. Scheduler interface 350 may send an acceptance message to scheduler system 120 upon start of execution of the test.

Scheduler interface 350 may also receive an email identifier to which a completion of a test may be notified. Thus, scheduler interface 350 may monitor the progress of the test and send an email notification upon completion of the execution of the test scripts corresponding to the requested test. Scheduler interface 350 may also send a completion message back to scheduler system 120 also upon completion of the test.

A suitable user interface at user system 110A may be designed to take advantage of various features described above. Accordingly, the description is continued with respect to an example user interface.

5. User Interface to Submit Test Requests

Figure 4:
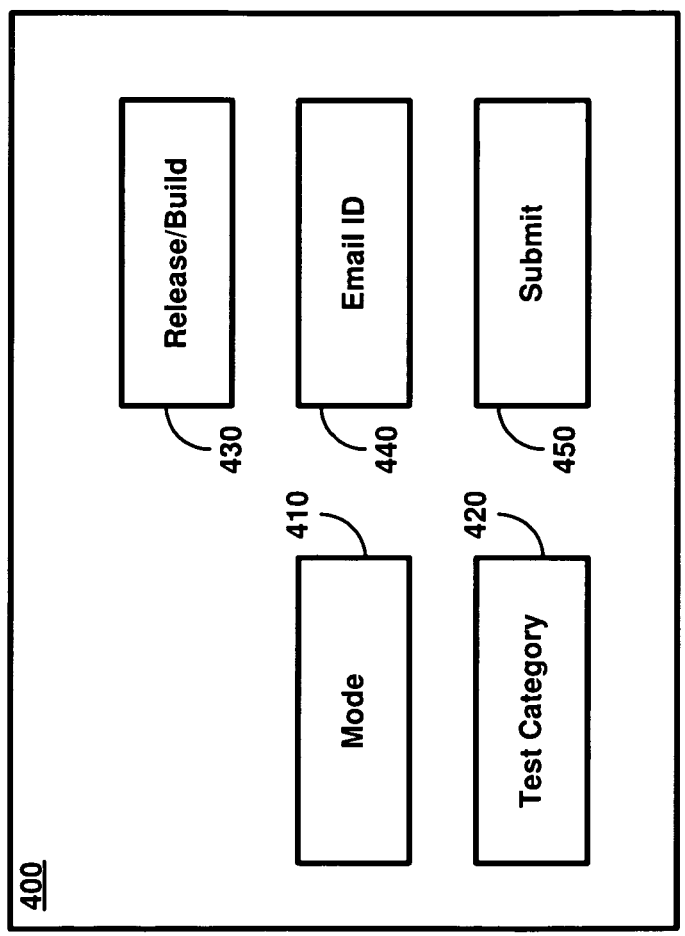
FIG. 4 is a diagram illustrating an example user interface using which a tester/user initiates a test in an embodiment of the present invention.

FIG. 4 depicts the contents of a user interface at user system 110A, using which a user may submit tests in an embodiment of the present invention. Field 410 may be used to specify one of the modes (16/32 bit direct/indirect addressing) sought to be tested, test category 420 may be used to specify the type of test case (e.g., one of Functionality, Robustness Test, Conformance and Performance, noted above), Release/Build 430 may be used to specify the version identifier of the specific software sought to be tested, and email identifier 440 may be used to specify an email identifier at which notification of status of completion of the test is sought to be received at.

The data in each of the fields 410/420/430 and 440 may be specified using any suitable interface (e.g., radio button, menu selections, etc.). Once the user specifies the desired data in the specific fields, the submit field 450 may be selected to submit the test. A test request is generated and sent to scheduling system 120 as a result. The manner in which the test requests can be processed is described in further detail below with respect to the internals of scheduler system 120 in one embodiment.

6. Scheduling System

FIG. 5 is a block diagram illustrating the internals of a scheduler system in an embodiment. Scheduler system 120 is shown containing resource table 510, tester system interface 520, job queue 530, user system interface 540 and network interface 550. Each block is described below in further detail.

Network interface 550 provides the physical, electrical and protocol interfaces to enable packets of data to be sent to and received from various external systems (e.g., tester systems, user systems and database, not shown, from which software builds can be downloaded). The data forms the basis for receiving test requests, downloading of various builds of the software, sending test results, etc. Network interface 550 may be implemented using technologies such as Ethernet and TCP/IP, well known in the relevant arts.

Resource table 510 represents a table storing the configuration information (of step 210) in one embodiment. The table indicates the specific modes in which each tester system 160A-160M is configured for testing and the access interface using which the test requests can be forwarded. Job queue 530 stores data representing the status of the test requests received from user systems 110A-110N. Both 510/530 may be stored in a random access memory provided within scheduler system 120.

User system interface 540 receives test requests from user systems 110A-110N, examines resource table 510 for a suitable and available resource, and forwards the test request to such available tester system. The corresponding job is then placed in job queue 530 with a status of RUNNING, as depicted in FIG. 7A.

The job queue may store data indicating at least the tests that are not yet completed. In an embodiment, the information for each test is maintained for a pre-specified duration after completion of the test and the corresponding entry is removed thereafter. The completed jobs are shown with a status of DONE and the rows may be used for saving information related to additional job requests received thereafter. Thus, in FIG. 7A, three test requests corresponding to rows 701, 702 and 704 are shown to be in RUNNING state, while the job corresponding to row 703 is shown to be in DONE state.

Tester system interface 520 receives resource information (as registration information) from scheduler interface 350 of all the tester systems 160A-160M, and populates resource table 510 accordingly.

Thus, with respect to FIG. 6, columns 610, 620, 630 and 640 may be populated based on the resource information received from scheduler interfaces. Assuming that tester system 160A has a name of Hpux123, is setup in 32 bit direct addressing mode, has an IP address of 165.233.245.2, and requests can be forwarded to TCP port 2050, row 601 is set accordingly. Remaining rows 602-604 are described similarly for corresponding tester systems.

Tester system interface 520 may further receive acceptance messages from a tester system indicating that a test request has been accepted and is being processed. In such a case, tester system interface 520 may set column 650 of the appropriate row to BUSY status. When a notification of completion of the test is received, the corresponding row is then set to FREE status. Thus, the systems corresponding to rows 601-603 are shown as being at BUSY status and the system corresponding to row 604 is shown as being at FREE status.

Assuming that a new test request is received and forwarded to HPUX432, the change in job queue status is depicted in FIG. 7B. As may be readily observed, a new job with number 2122 has been added in row 703 with a status RUNNING (replacing the previous DONE job of 2907 of FIG. 7A). The job ids, etc., may be computed dynamically as unique numbers to identify each test and stored in column 710 upon receiving of the corresponding test requests.

It should be appreciated that the features described above can be implemented in various embodiments as a desired combination of one or more of hardware, software, and firmware. The description is continued with respect to an embodiment in which various features are operative when software instructions are executed.

7. Digital Processing System

Figure 8:
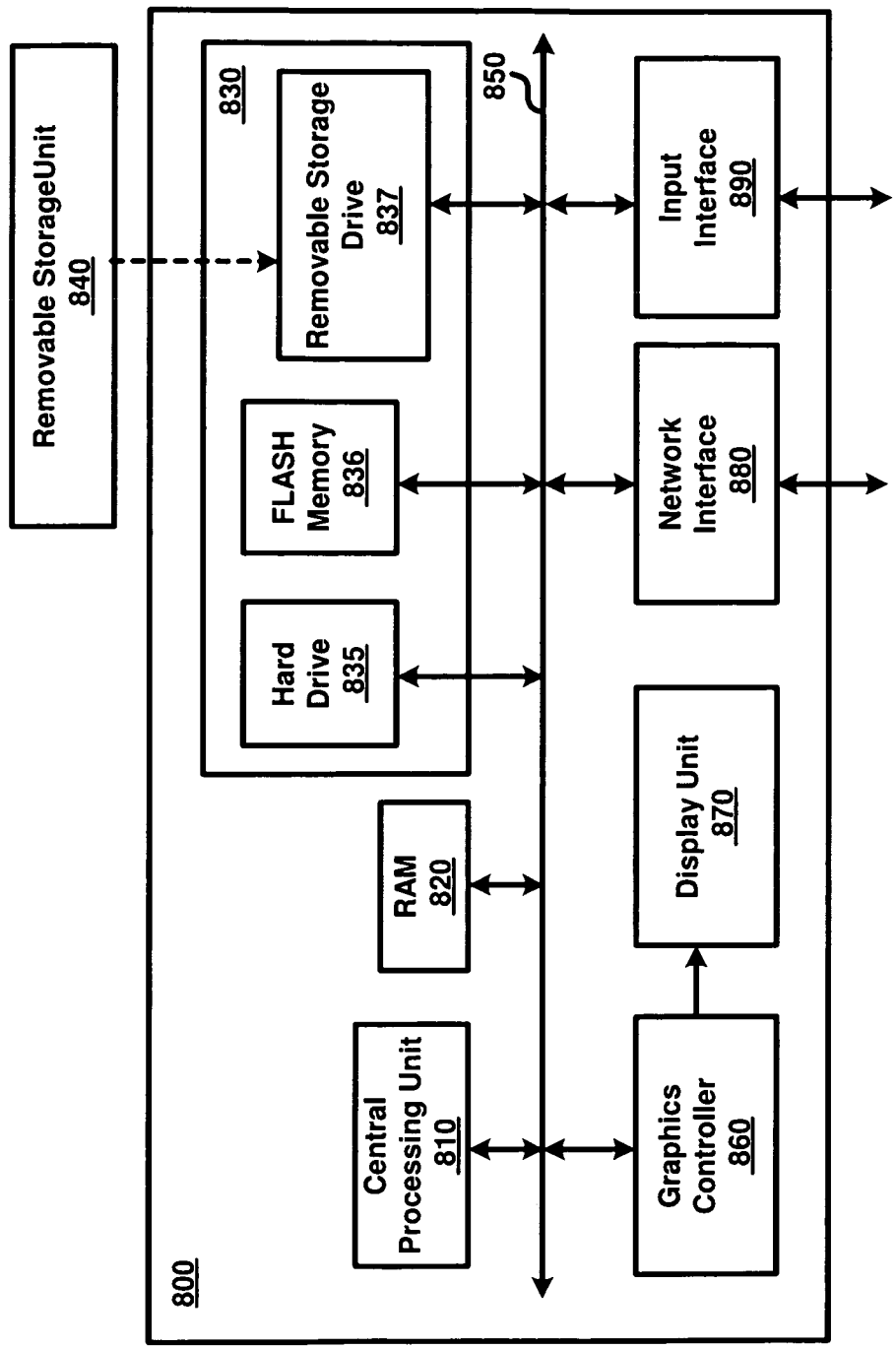
FIG. 8 is a block diagram illustrating the details of scheduler system in one embodiment.

FIG. 8 is a block diagram illustrating the details of digital processing system 800 in which various aspects of the present invention are operative by execution of appropriate software instructions. Digital processing system 800 may correspond to scheduler system 120.

Digital processing system 800 may contain one or more processors (such as a central processing unit (CPU) 810), random access memory (RAM) 820, secondary memory 830, graphics controller 860, display unit 870, network interface 880, and input interface 890. All the components except display unit 870 may communicate with each other over communication path 850, which may contain several buses as is well known in the relevant arts. The components of FIG. 8 are described below in further detail.

CPU 810 may execute instructions stored in RAM 820 to provide several features of the present invention described in sections above. CPU 810 may contain multiple processing units, with each processing unit potentially being designed for a specific task. Alternatively, CPU 810 may contain only a single general-purpose processing unit. RAM 820 may receive instructions from secondary memory 830 using communication path 850. RAM 820 may also store/provide data used (e.g., portions of the data depicted in FIG. 6, 7A/7B) during execution of the instructions.

Graphics controller 860 generates display signals (e.g., in RGB format) to display unit 870 based on data/instructions received from CPU 810. Display unit 870 contains a display screen to display the images defined by the display signals. Input interface 890 may correspond to a keyboard and a pointing device (e.g., touch-pad, mouse) and may be used to provide various inputs. Network interface 880 provides connectivity to a network (e.g., using Internet Protocol), and may be used to communicate with other connected systems (such as Tester Systems 160A-160M, User Systems 110A-110N) of FIG. 1.

Secondary memory 830 may contain hard drive 835, flash memory 836, and removable storage drive 837. Secondary memory 830 may store the data and software instructions, which enable digital processing system 800 to provide several features in accordance with the present invention.

Some or all of the data and instructions may be provided on removable storage unit 840, and the data and instructions may be read and provided by removable storage drive 837 to CPU 810. Floppy drive, magnetic tape drive, CD-ROM drive, DVD Drive, Flash memory, removable memory chip (PCMCIA Card, EPROM) are examples of such removable storage drive 837.

Removable storage unit 840 may be implemented using medium and storage format compatible with removable storage drive 837 such that removable storage drive 837 can read the data and instructions. Thus, removable storage unit 840 includes a computer readable (storage) medium having stored therein computer software and/or data. However, the computer (or machine, in general) readable medium can be in other forms (e.g., non-removable, random access, etc.).

In this document, the term "computer program product" is used to generally refer to removable storage unit 840 or hard disk installed in hard drive 835. These computer program products are means for providing software to digital processing system 800. CPU 810 may retrieve the software instructions, and execute the instructions to provide various features of the present invention described above.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A system to test processors, said system comprising:
   a plurality of testers, wherein each tester comprises a processor to be tested, and wherein a subset of said plurality of testers is configured to operate in a mode of a plurality of modes during testing, and wherein said processor is operable to be configured in each of said plurality of modes, and wherein said plurality of modes comprises a first addressing mode of a first number of bits and a second addressing mode of a second number of bits;
   a plurality of user systems, wherein a user system of said plurality of user systems is operable to select a mode from said plurality of modes for testing of a respective processor included in a respective tester, and wherein said user system of said plurality of user systems is operable to send a test request comprising said selected mode; and
   a scheduler system operable to receive said test request and responsive thereto select a tester from said plurality of tester systems to carry out said testing according to said selected mode and further according to said test request, wherein said scheduler system is operable to select said tester based on said selected mode of said processor of said tester, wherein the scheduler system maintains configuration information indicating which processors are setup to test which modes, and also status information indicating which tester systems are presently available for testing.

2. The system of claim 1, wherein a processor associated with a tester from said plurality of testers is a graphics processing unit.

3. The system of claim 1, wherein one of said plurality of modes is an addressing mode.

4. The system of claim 1, wherein one of said plurality of user systems comprises a user interface operable to provide said plurality of modes for user selection thereof, and wherein said user interface is further operable to provide a plurality of test categories for user selection thereof to be executed by a tester, and wherein said user interface is further operable to provide a plurality of build version numbers associated with a software for user selection thereof to be executed during said testing, and wherein said test request comprises information provided through said user interface.

5. The system of claim 1, wherein said selected tester comprises:
   a scheduler interface operable to receive said test request and responsive thereto execute a plurality test scripts to perform said testing in said selected mode.

6. The system of claim 1, wherein said test request comprises an electronic mail address, wherein said electronic mail address receives a processing status associated with said testing.

7. The system of claim 1, wherein a tester from said subset of plurality of testers is operable to determine said plurality of modes, and wherein a determined plurality of modes is communicated to said scheduler system for registration thereof in association with said tester.

8. The system of claim 7, wherein said tester of said subset of plurality of testers is further operable to communicate an address associated therewith to said scheduler system for registration thereof.

9. A non-transitory computer-useable storage medium having computer-readable program code stored thereon for causing a computer system to execute a method of testing a processor, said method comprising:
   maintaining a plurality of mode information associated with a plurality of testers respectively in a scheduler system, wherein each mode information comprises a plurality of modes operable to configure its associated tester comprising a respective processor to be tested in response to a user selection thereof, and wherein said respective processor is operable to be configured in each of said plurality of modes, and wherein said plurality of modes comprises a first addressing mode of a first number of bits and a second addressing mode of a second number of bits;
   receiving a test request from a user, wherein said test request comprises a user selected mode of said plurality of modes;
   in response to said test request, said scheduler system selecting a tester from said plurality of testers to carry out a test according to said test request, wherein said selecting of said tester is performed based on said processor having a selected mode corresponding to said user selected mode, and wherein said scheduler system comprises configuration information indicating which processors are setup to test which modes, and also status information indicating which testers are presently available for testing; and
   transmitting said test request to said selected tester to carry out said test according to said test request.

10. The computer readable medium of claim 9, wherein said method further comprises:
    maintaining status information associated with one or more testers with pending test requests, and wherein said selecting is further based on said status information, and wherein said selection of said tester to carry out said test occurs if said tester has no pending test requests.

11. The computer readable medium of claim 10, wherein said method further comprises:
    receiving a response from said selected tester that said testing is complete; and
    updating said status information to indicate that said test request associated with said selected tester is no longer pending.

12. The computer readable medium of claim 9, wherein said method further comprises:
    receiving said plurality of mode informations from said plurality of testers, wherein said plurality of mode informations is updatable.

13. The computer readable medium of claim 9, wherein said method further comprises:

receiving an address associated with each tester of said plurality of testers, wherein said transmitting uses an address associated with said selected tester.

14. The computer readable medium of claim 9, wherein said test request comprises an electronic mail address to be notified of pending and completion of said test.

15. The computer readable medium of claim 9, wherein said test request comprises a build version number of a software to be used during said test associated with said selected tester, and wherein said build version number of said software is transmitted to said selected tester via said test request.

16. The computer readable medium of claim 9, wherein said test request comprises a category of test to be performed by said selected tester.

17. The computer readable medium of claim 9, wherein said tester processor is a graphics processing unit.

18. A method of testing a processor, said method comprising:
   maintaining a plurality of mode information associated with a plurality of testers respectively in a scheduler system, wherein each mode information comprises a plurality of modes operable to configure its associated tester comprising a respective processor to be tested in response to a user selection thereof, and wherein said respective processor is operable to be configured in each of said plurality of modes, and wherein said plurality of modes comprises a first addressing mode of a first number of bits and a second addressing mode of a second number of bits;
   receiving a test request from a user, wherein said test request comprises a user selected mode of said plurality of modes;
   in response to said test request, said scheduler system selecting a tester from said plurality of testers to carry out a test according to said test request, wherein said selecting of said tester is performed based on said processor having a selected mode corresponding to said user selected mode, and wherein said scheduler system comprises configuration information indicating which processors are setup to test which modes, and also status information indicating which testers are presently available for testing; and
   transmitting said test request to said selected tester to carry out said test according to said test request.

19. The method of claim 18 further comprising:
   maintaining status information associated with one or more testers with pending test requests, and wherein said selecting is further based on said status information, and wherein said selection of said tester to carry out said test occurs if said tester has no pending test requests.

20. The method of claim 19 further comprising:
   receiving a response from said selected tester that said testing is complete; and
   updating said status information to indicate that said test request associated with said selected tester is no longer pending.

21. The system of claim 3, wherein one of said plurality of modes is an indirect addressing mode.

22. The system of claim 1, wherein said first number of bits are a first number of address bits and said second number of bits are a second number of address bits.

* * * * *